(12) United States Patent
Laidig et al.

(10) Patent No.: US 7,355,681 B2
(45) Date of Patent: Apr. 8, 2008

(54) OPTICAL PROXIMITY CORRECTION USING CHAMFERS AND ROUNDING AT CORNERS

(75) Inventors: Thomas Laidig, Point Richmond, CA (US); Markus Franciscus Antonius Eurlings, Breda (NL)

(73) Assignee: ASML Masktools B.V., Veldhoven (NL)

( * ) Notice: Subject to any disclaimer, the term of this patent is extended or adjusted under 35 U.S.C. 154(b) by 78 days.

(21) Appl. No.: 11/101,649

(22) Filed: Apr. 8, 2005

(65) Prior Publication Data

US 2005/0280800 A1    Dec. 22, 2005

Related U.S. Application Data

(60) Provisional application No. 60/560,615, filed on Apr. 9, 2004.

(51) Int. Cl.
*G03B 27/32* (2006.01)
*G03B 27/42* (2006.01)
*G03F 9/00* (2006.01)

(52) U.S. Cl. .................. 355/77; 355/53; 430/5

(58) Field of Classification Search .......... 355/52, 355/53, 55, 77; 430/5, 20, 30, 311; 716/19
See application file for complete search history.

(56) References Cited

U.S. PATENT DOCUMENTS

| | | | |
|---|---|---|---|
| 5,229,255 A | 7/1993 | White | |
| 5,242,770 A | 9/1993 | Chen et al. | |
| 5,256,505 A | 10/1993 | Chen et al. | |
| 5,288,569 A | 2/1994 | Lin | |
| 5,324,600 A | 6/1994 | Jinbo et al. | |
| 5,362,584 A | 11/1994 | Brock et al. | |
| 5,424,154 A | 6/1995 | Borodovsky | |
| 5,436,095 A | 7/1995 | Mizuno et al. | |
| 5,447,810 A | 9/1995 | Chen et al. | |
| 5,538,815 A | 7/1996 | Oi et al. | |
| 5,663,893 A | 9/1997 | Wampler et al. | |
| 5,707,765 A | 1/1998 | Chen | |
| 5,723,233 A | 3/1998 | Garza et al. | |
| 5,767,974 A * | 6/1998 | Higashiguchi et al. | 356/394 |
| 5,821,014 A | 10/1998 | Chen et al. | |
| 5,827,623 A | 10/1998 | Ishida et al. | |
| 5,867,253 A | 2/1999 | Nakae | |
| 5,958,635 A | 9/1999 | Reich et al. | |

(Continued)

FOREIGN PATENT DOCUMENTS

JP    9-34101    2/1997

(Continued)

OTHER PUBLICATIONS

U.S. Appl. No. 60/557,833, filed Mar. 30, 2004.

*Primary Examiner*—Henry Hung Nguyen
(74) *Attorney, Agent, or Firm*—McDermott Will & Emery LLP

(57) ABSTRACT

Disclosed is a method of optimizing a design to be formed on a substrate. The method includes approximating rounding of at least one corner of an image of the design; generating a representation of the design further to the approximate rounding of the at least one corner; generating an initial representation of a mask utilized to image the design based on the representation; and performing Optical Proximity Correction (OPC) further to the initial representation of the mask.

16 Claims, 15 Drawing Sheets

U.S. PATENT DOCUMENTS

| | | |
|---|---|---|
| 5,969,441 A | 10/1999 | Loopstra et al. |
| 6,044,007 A | 3/2000 | Capodieci |
| 6,046,792 A | 4/2000 | Van Der Werf et al. |
| 6,114,071 A | 9/2000 | Chen et al. |
| 6,280,887 B1 * | 8/2001 | Lu .................................. 430/5 |
| 6,403,477 B1 * | 6/2002 | Tounai ........................ 438/669 |
| 6,536,032 B1 * | 3/2003 | Tanaka et al. ................. 716/21 |
| 6,631,511 B2 * | 10/2003 | Haffner et al. ................. 716/21 |
| 6,670,081 B2 | 12/2003 | Laidig et al. |
| 7,003,756 B2 * | 2/2006 | Zhang ......................... 716/19 |
| 2002/0083408 A1 | 6/2002 | Haffner et al. |

FOREIGN PATENT DOCUMENTS

| | | |
|---|---|---|
| JP | 09034101 | 2/1997 |
| JP | A-2000-91436 | 3/2000 |
| JP | A-2000-147744 | 5/2000 |

* cited by examiner

OPTICAL PROXIMITY CORRECTION USING CHAMFERS AND ROUNDING AT CORNERS

CLAIM OF PRIORITY

This application claims priority from U.S. provisional application No. 60/560,615, entitled "OPTICAL PROXIMITY CORRECTION USING CHAMFERS AND ROUNDING AT CORNERS," filed Apr. 9, 2004, the disclosure of which is incorporated herein by reference in its entirety.

FIELD OF THE INVENTION

The present invention relates to photolithography, and in particular optical proximity techniques correction using chamfers and rounding at corners.

BACKGROUND

Lithographic apparatus can be used, for example, in the manufacture of integrated circuits (ICs). In such a case, the mask used in manufacture may contain a circuit pattern corresponding to an individual layer of the IC, and this pattern can be imaged onto a target exposure field (e.g. comprising one or more dies) on a substrate (silicon wafer) that has been coated with a layer of radiation-sensitive material (resist). In general, a single wafer will contain a whole network of adjacent target exposure fields that are successively irradiated via the projection system, one at a time. In one type of lithographic projection apparatus, each target exposure field is irradiated by exposing the entire mask pattern onto the target exposure field in one go; such an apparatus is commonly referred to as a wafer stepper. In an alternative apparatus—commonly referred to as a step-and-scan apparatus—each target exposure field is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens;" however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple-stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or the smallest space between two lines. Thus, the CD determines the overall size and density of the designed circuit.

Of course, one of the goals in integrated circuit fabrication is to faithfully reproduce the original circuit design on the wafer (via the mask). However, because of the increasingly microscopic size of lithographic features and high resolution systems, the resulting features printed on the substrate tend to have some rippling, i.e., edges that are supposed to be straight are not straight. This rippling is related to "ringing" in filter theory, and is a natural side effect of efforts to accentuate the high spatial frequencies needed to image small features. Others factors that may cause rippling are known by those of ordinary skill in the art. FIG. 1 illustrates features printed on a substrate suffering from the problem of rippling.

In the current state of the art, model-based OPC corrects for mismatch between a target image and predicted image using the following steps. (1) A target layer is divided into a plurality of sections. (2) A predicted image is evaluated at one "evaluation point" (typically at the center) of each section of the plurality of sections. (3) Based on respective evaluations, features to be printed are modified in accordance with the respective evaluation at the center of the corresponding section to minimize the mismatch between the target and predicted image. In low k1 systems with the occurrence of rippling, or in systems where rippling is more prevalent, the conventional model based OPC methods accentuate rippling, as shown generally by FIG. 1, in cases where the evaluation points happen by chance not to be placed in ideally representative locations within their respective sections.

More particularly, FIG. 2 illustrates a target image 20 superimposed on a predicted image 22, which has rippling.

The target image 20 is divided into a plurality of sections 24, and the images 22, 24 are evaluated at evaluation points 26 for each section 24. Each evaluation point 26 is located at the center of the respective section 24. Based on these evaluations, the target image is modified (modified mask 30), as illustrated by FIG. 3. The modified mask takes into account the mismatch between the target image 20 and predicted image 22. With respect to the evaluation at the center of each of the plurality of sections 24, an offset of $\Delta n$ is applied to the target image 20, where n represents the corresponding section 24. In other words, the resulting new edge is adjusted downwardly in each place where the original predication was high, and is adjusted upwardly in each place where the original prediction was low, as would be expected.

FIG. 4 illustrates the new predicted image 40 based on the modified mask 30. By comparison with the predicted image 22, in the given example conventional model based OPC accentuates rippling of the new predicted image 40, which increases the likelihood of breaking or bridging depending on surrounding structure.

Improved results can in principle be obtained by choosing a "better" evaluation point, and some limited strategies exist in this regard. In particular, the evaluation points of sections at or near corners may be moved back away from that corner to avoid over-correction. These methods are helpful, but are difficult to apply except in simple cases due to the complexity of the interaction between surrounding contextual features and the ripples observed on a particular edge of interest.

Moreover, model based OPC uses either an aerial model or a calibrated model. A calibrated model must consider mask properties, characteristics of the tools to create the mask, resist properties, etc. Because of this, there are many disadvantages to using a calibrated model. They include extensive calibration, including building a mask and exposing wafers, and factoring in arbitrary imaging properties that cannot be attributed to the mask, semiconductor, or any associated property. The main disadvantage is that in order to calibrate a model, a reasonable mask must already exist. Thus, industry often uses the aerial model for model based OPC, because it is expedient and does not rely on existing tools. However, aerial models do not factor in product and manufacturing imperfections, as in the case of using a calibrated model.

There has yet to be created a way for eliminating mismatch between a target image and predicted image to approximate real life imperfections.

SUMMARY

The teachings herein alleviate the above noted problems and provide a novel method of optimizing a design to be formed on a substrate. The steps include approximating rounding of at least one corner of an image of the design; generating a representation of the design further to the approximate rounding of the at least one corner; generating an initial representation of a mask utilized to image the design based on the representation; and performing Optical Proximity Correction (OPC) further to the initial representation of the mask.

OPC includes the steps of generating an image of the design further to the initial representation of the mask; evaluating deviation between the representation of the design further to the approximate rounding and the image; and determining whether a result of the evaluation of Step satisfies predefined constraints. In the event the result does not satisfy predefined constraints, a next representation of the mask may be generated in accordance with the results and OPC is repeated until the deviation meets predefined constraints.

Determination of approximate rounding may be based on a derivation of predefined rule, which may be used to define dimensions of a serif. Furthermore, rounding may be approximated by selecting a size of a cutout from a chamfer and chamfering the at least one corner to approximate rounding in accordance with the size of the cutout.

When the chamfered corner is adjacent to another corner, further adjustments may be necessary, such as reducing the size of at least one of the first chamfer and the second chamfer so that the first chamfer and the second chamfer do not intersect. Alternatively, the size of the first chamfer and the second chamfer may be reduced proportionally so that the first chamfer and the second chamfer do not intersect.

Yet another novel concept includes a method for enhancing OPC. The steps include determining rounding of corners of the initial representation of the mask based on mask manufacturing constraints; and generating a modified mask representation based on the initial representation in which corner rounding is applied. Rounding at each corner has a predetermined radius.

Accordingly, both rounding of corners due to imaging constraints and rounding of mask corners due to mask manufacturing constraints may be factored.

Additional objects, advantages and novel features will be set forth in part in the description which follows, and in part will become apparent to those skilled in the art upon examination of the following and the accompanying drawings or may be learned by production or operation of the examples. The objects and advantages of the present teachings may be realized and attained by practice or use of the methodologies, instrumentalities and combinations particularly pointed out in the appended claims.

BRIEF DESCRIPTION OF THE DRAWINGS

The drawing figures depict one or more implementations in accordance with the present teachings, by way of example only, not by way of limitation. In the figures, like reference numerals refer to the same or similar elements.

DESCRIPTION

Described in related U.S. patent application No. 60/557,833 (the "'833" patent application), entitled "Apparatus, Method and Program Product for Suppressing Waviness of Features to be printed using Photolithographic Systems," filed on Mar. 30, 2004, are novel concepts for overcoming inconsistencies in a predicted image, by adjusting a mask accordingly. This application is incorporated herein by reference in its entirety.

Figure 1:
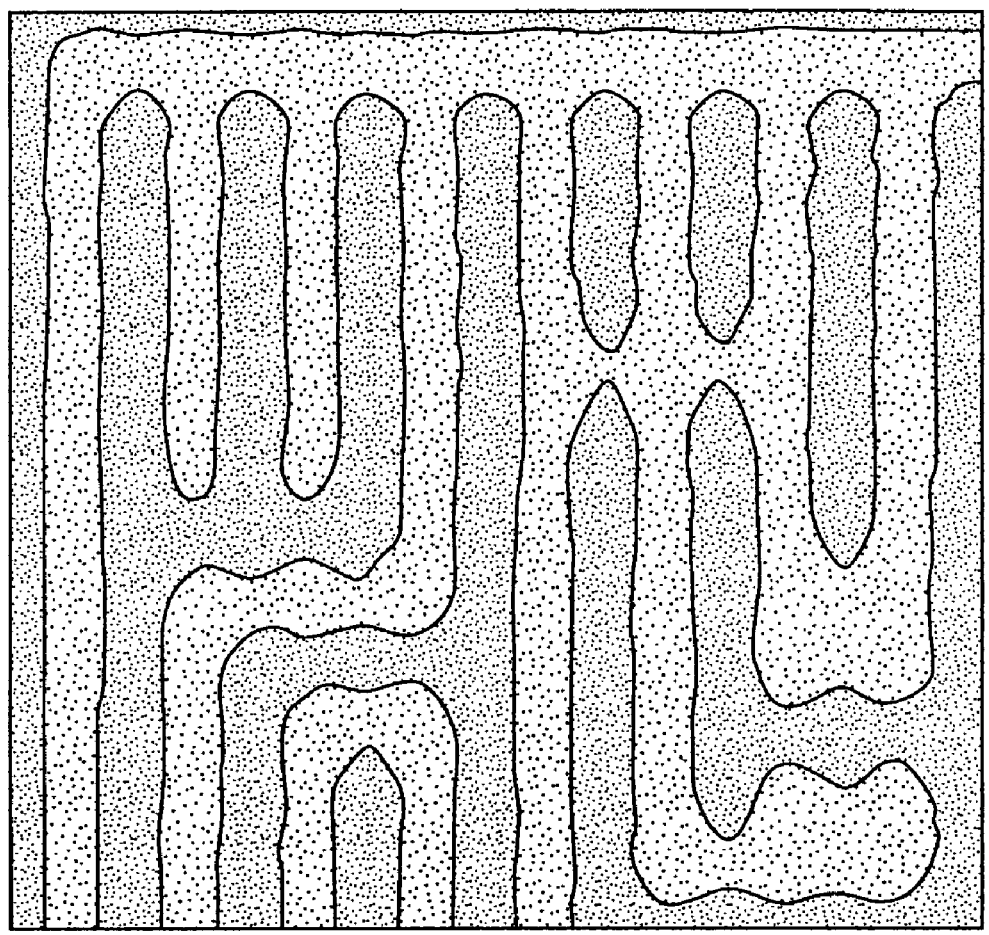
FIG. 1 illustrates exemplary features printed on a substrate suffering from rippling.
Figure 2:
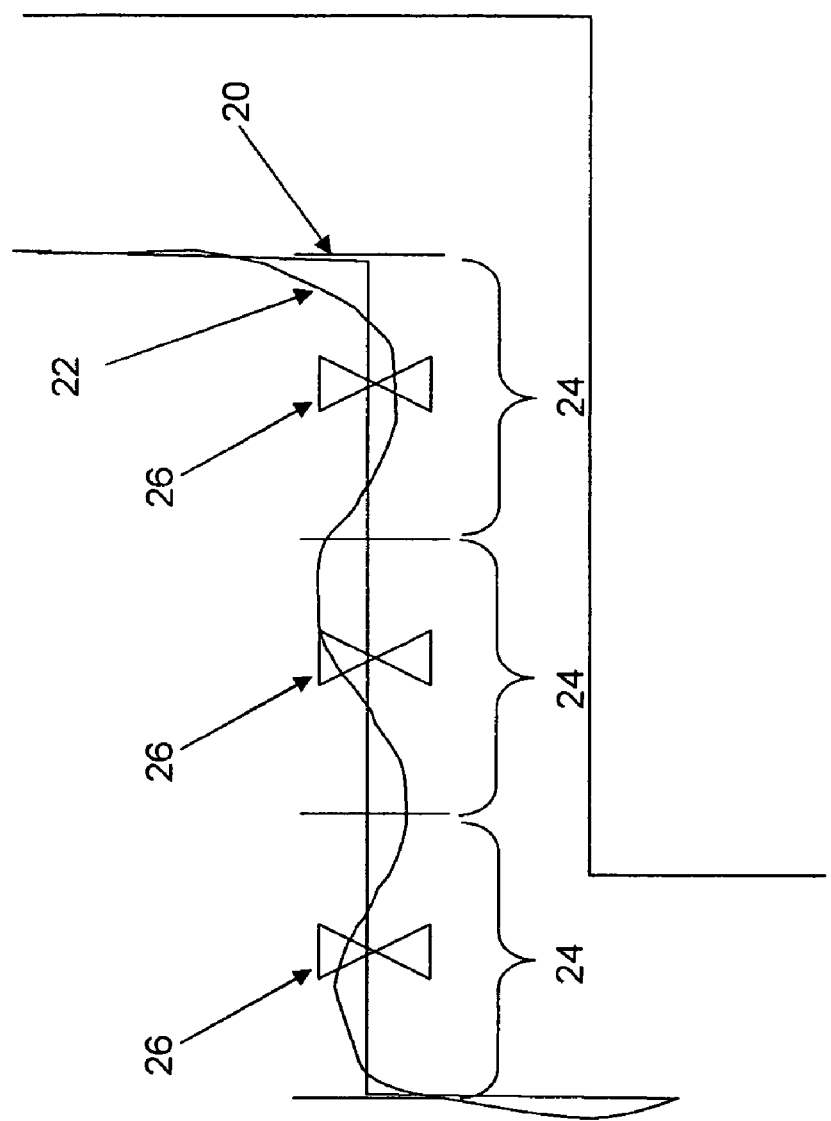
FIG. 2 illustrates an exemplary target image and corresponding predicted image suffering from rippling.
Figure 3:
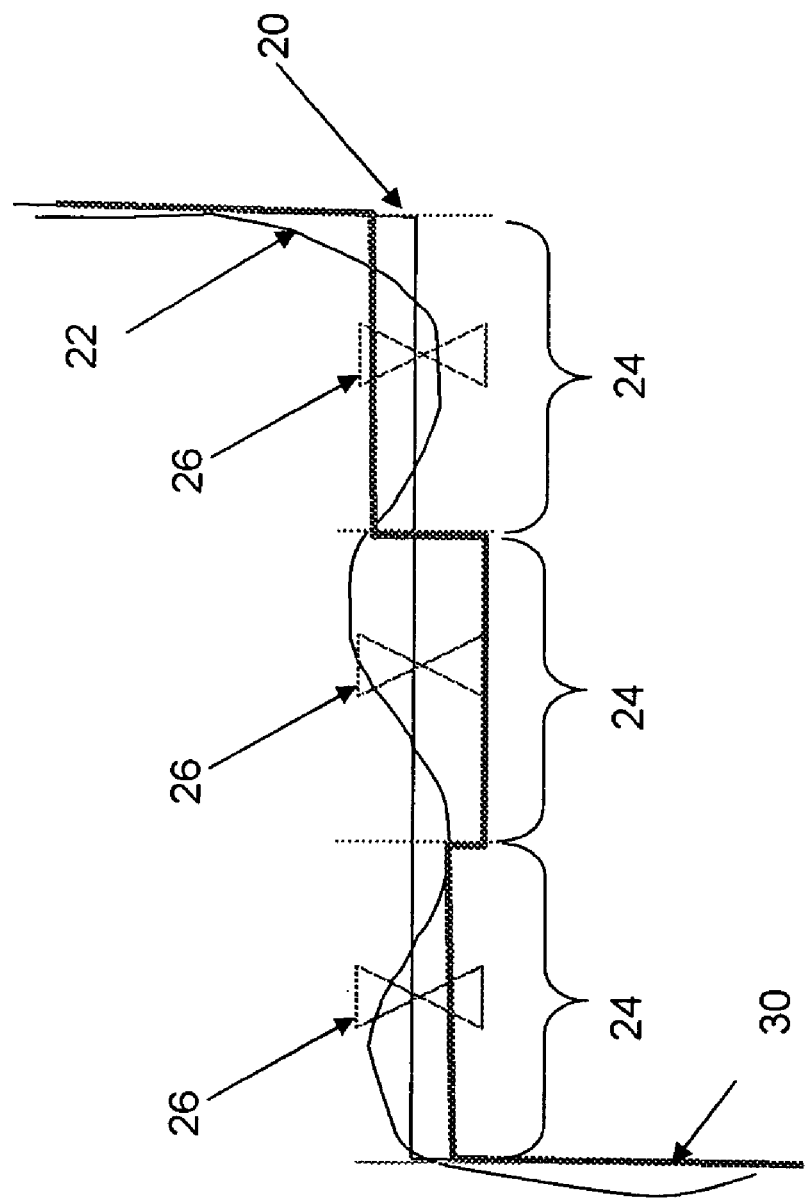
FIG. 3 illustrates the target and predicted images of FIG. 2 and an exemplary modified mask based on the evaluation of the images of FIG. 2.
Figure 4:
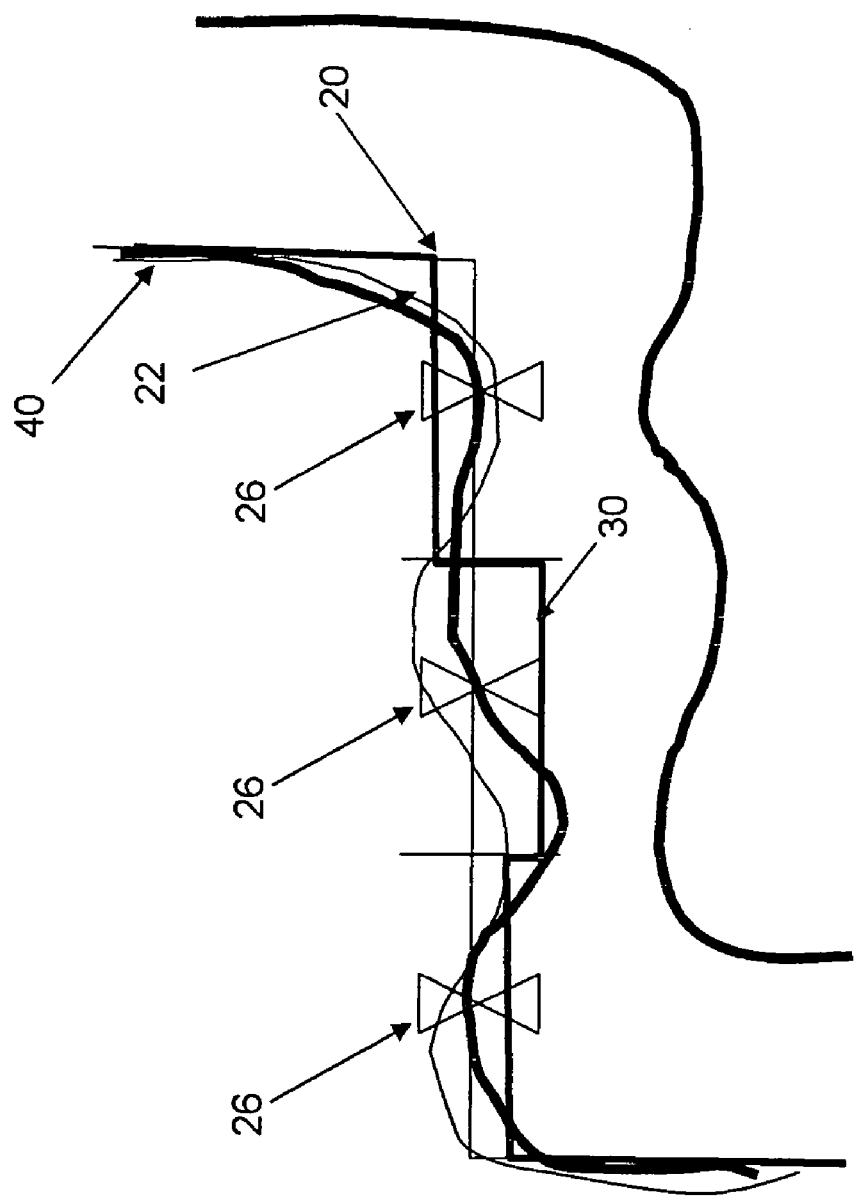
FIG. 4 illustrates an exemplary predicted image based on the modified mask of FIG. 3.
Figure 5A:
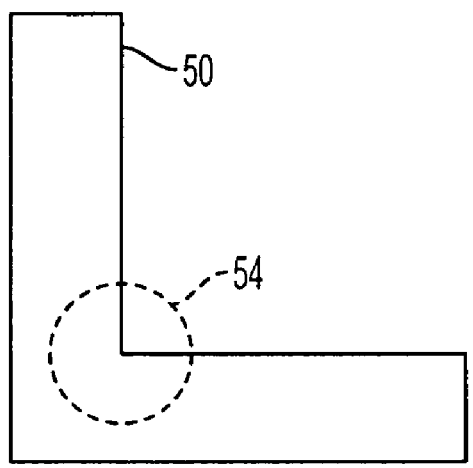
FIG. 5A illustrates an ideal feature to be printed.
Figure 5B:
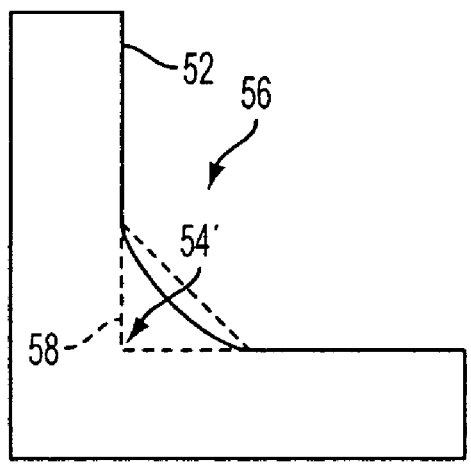
FIG. 5B illustrates the corresponding actual feature to be printed.

The inventors have further devised novel concepts for reducing rippling of a predicted image and other negative affects by compensating the target image for known printing manufacture limitations. With regard to one such limitation, there has yet been devised a way to print corners beyond a predetermined sharpness. For instance, FIG. 5A illustrates an ideal feature 50, and FIG. 5B illustrates the actual feature 52 printed or a predicted image of the feature 52. The ideal feature 50 has an ideal corner 54 of an infinite sharpness, but because of manufacturing and physical limitations, the shape of ideal corner 54 is practically unachievable.

Described in the '833 application are novel approaches for compensating for corner rounding in the target image in model OPC. These included applying adjustment factors to evaluations taken nearing a corner or at a corner. Alternatively, evaluation points nearing and located at a corner may be eliminated entirely. Because corners will always have some rounding, the adjustment factor takes this into account, and adjustments are made to the target image accordingly.

As in the present invention, another novel approach is to modify the target image to simulate rounding at each corner. Corners will always suffer some rounding during the printing process, and OPC treatments can introduce undesirable results ("ringing", "necking", and "bridging") as a result of attempting to correct for this inevitable rounding. Whereas the '833 application teaches methods by which mismatches due to corner rounding can be selectively ignored, the present invention alters the target in a way that approximates the inevitable corner rounding, and then applies OPC to attempt to reproduce this modified target.

There has been much development of rule-based OPC using serifs. U.S. Pat. Nos. 5,663,893, 5,707,765 and 6,670,081 provide exemplary descriptions of OPC using serifs. These patents are incorporated herein by reference in their entirety.

Generally serifs are sub-lithographic square shaped features positioned on corners of a circuit feature. They serve to "sharpen" the corners in the final transferred design on a wafer, for improving the correspondence between the actual circuit design and the final transferred circuit pattern on the photoresist layer. It is known that "positive" serifs at convex vertices adjust exposure energy of the mask at the vertex to prevent loss of the corner. "Negative" serifs at concave vertices remove a portion of the mask pattern at the concave vertex so as to attempt to maintain an accurate representation of the concave vertex in the final pattern. Based on the rules developed for optimizing serifs, there is a general understanding of the limitations of the "sharpness of a corner."

In typical OPC using serifs, each edge of a given serif (both positive and negative) is adjustable relative to every other edge of a given serif so as to allow the overall dimension of the serif to be modified. As well, each serif can be modified independently of every other serif. As the '081 patent explains, these modifications of serifs are governed by predefined rules, which are selected/defined by the user in accordance with the feature pattern to be generated. It is well known that such rules will vary in accordance with different circuit design features. Of course, these rules may also be of the sort for serifs of fixed dimensions and spacing threshold(s).

Figure 6A:
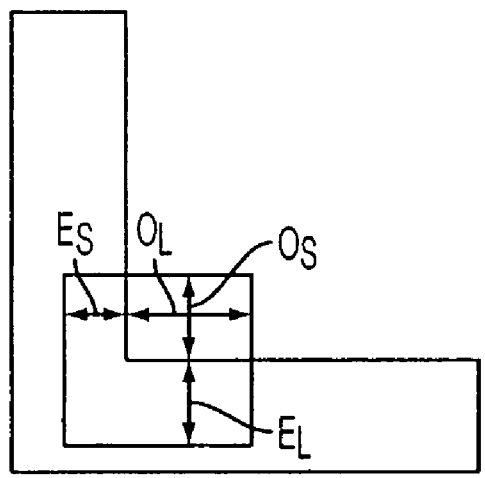
FIG. 6A illustrates the overlap portion of a negative serif relative to a feature.
Figure 6B:
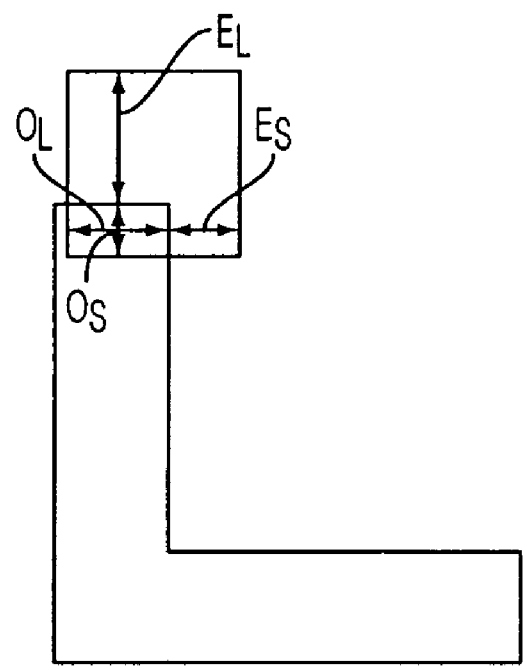
FIG. 6B illustrates the overlap portion of a positive serif relative to the feature.

FIGS. 6A and 6B illustrates a pattern to be printed using serifs. The positions and dimensions of the serifs have been exaggerated for purposes of illustration and explanation. Each serif has an "overlap portion" and an "extension portion." The portion of a negative serif that overlaps the background of the feature is the overlap portion (FIG. 6A), whereas the portion of a positive serif that overlaps the actual feature is the overlap portion (FIG. 6B). The overlap of the serif can be defined as "short overlap" $O_S$ and "long overlap" $O_L$. Similarly, extensions can be defined as a "short extension" $E_S$ and a "long extension" $E_L$. Using any rule-based approach for sizing and positioning serifs, each serif for a given corner can be defined.

The inventors have found that the optimal chamfer, i.e. corner cutoff, can be derived in the same way as optimal serif dimensions. The optimal chamfering rules may differ from the ideal rules for serif correction, but the rules will be similar in form. Referring back to FIG. 5B, it is assumed that the rounding of corner 56 has been minimized using serifs, as described above, and what remains is the residual corner rounding that cannot be eliminated. By chamfering corner 54' to approximate or simulate this expected rounding before OPC, as seen in FIG. 5B, the subsequent OPC treatment will not be led to compromise the correction of nearby areas in an attempt to eliminate corner rounding.

As shown in FIG. 5B corner rounding takes the form of a smooth curve. Such a shape is difficult or impossible for conventional EDA software to handle. The corner may be approximated with a sequence of straight edges, in a "polygonal" approximation. A compromise may be found between the simplicity of such a polygon and the precision with which it approximates the ideal curved figure. The inventors have found a single diagonal edge, with symmetrical 45-degree angles at each end, to be a good compromise in most cases. Restricting the geometry to edges at angles that are multiples of 45 degrees has practical advantages in mask making, because most mask-writing machines must approximate other angles using a "stairstep" pattern. However, it shall be understood that a larger number of diagonal edges, and in some cases an angle other than 45 degrees, can better approximate the true corner rounding, and may be preferred in particular situations.

Assuming the case of a single chamfering edge, without restricting its angle, the chamfer cutout would be a triangle, chosen so that one of its legs equals the short overlap $O_S$, and the other equals the long overlap $O_L$. The values of $E_S$ and $E_L$, which are necessary to define a serif, are ignored when creating this chamfer. $O_S$ and $O_L$ normally differ in length because of differences in the lengths of the two original target edges, with the overlap shorter along the shorter edge.

This approximates the asymmetrical curve of the actual corner rounding found in such cases. To restrict the angle to 45 degrees, as in the preferred embodiment of this invention, the two legs of the triangle must have the same length, and the shorter length, $O_S$, is chosen.

Figure 7A:
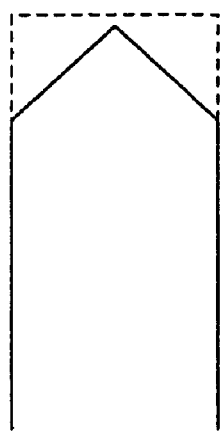
FIG. 7A illustrates possible interference of chamfering at adjacent corners.

Corners that are connected by two relatively long lines, such that the corner rounding (and the chamfering that approximates it) of one corner does not interfere with that of an adjacent corner, will have both $O_S$ and $O_L$ equal to some nominal chamfer amount. However, when lines between adjacent corners are relatively short, such as at an end of a line, sometimes referred to as a "U" edge, chamfering of one corner may interfere with the chamfering of an adjacent corner. This concept is illustrated by FIG. 7A.

Figure 7B:
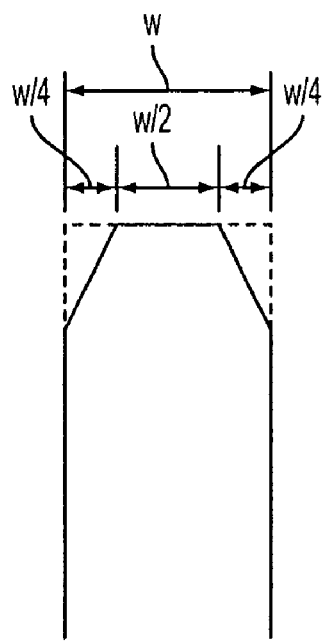
FIG. 7B illustrates chamfering adjustments to resolve the interference.

Typically, rules for serifs distinguish between placing a serif on a convex corner and a concave corner. Taking the convex rules as an example, consider a "nominal" serif size rule (corresponding to a chamfer size rule) of 40 nm. However, on short "U edges", as seen in FIG. 7B, the chamfer may be reduced so as to cut only one quarter of the line end. Of course, these rules may be modified so that the chamfer may cut any fraction of the line below one-half of the line end, for maintaining a "true" U edge.

This may be accomplished with the "ps_adj" (positive serif adjustment rule) parameter with an adjustment to the "parallel overlap" of the chamfer that is linearly dependent on the length of the U edge. For example, the nominal chamfer width could be 40 nm, and the parallel overlap adjustment could vary linearly from 0 nm at an edge length of 160 nm to −20 nm at an edge length of 80 nm. This produces a chamfer that is ¼ of the line width W, for any line width between 80 nm and 160 nm. At one end of this range, a 160 nm-wide line receives no adjustment, and the 40 nm nominal chamfer size is exactly ¼ of the 160 nm line width. At the other end of this range, an 80 nm-wide line receives a −20 nm adjustment to the 40 nm nominal chamfer size, yielding a 20 nm chamfer, which is again ¼ of the line width.

Figure 8:
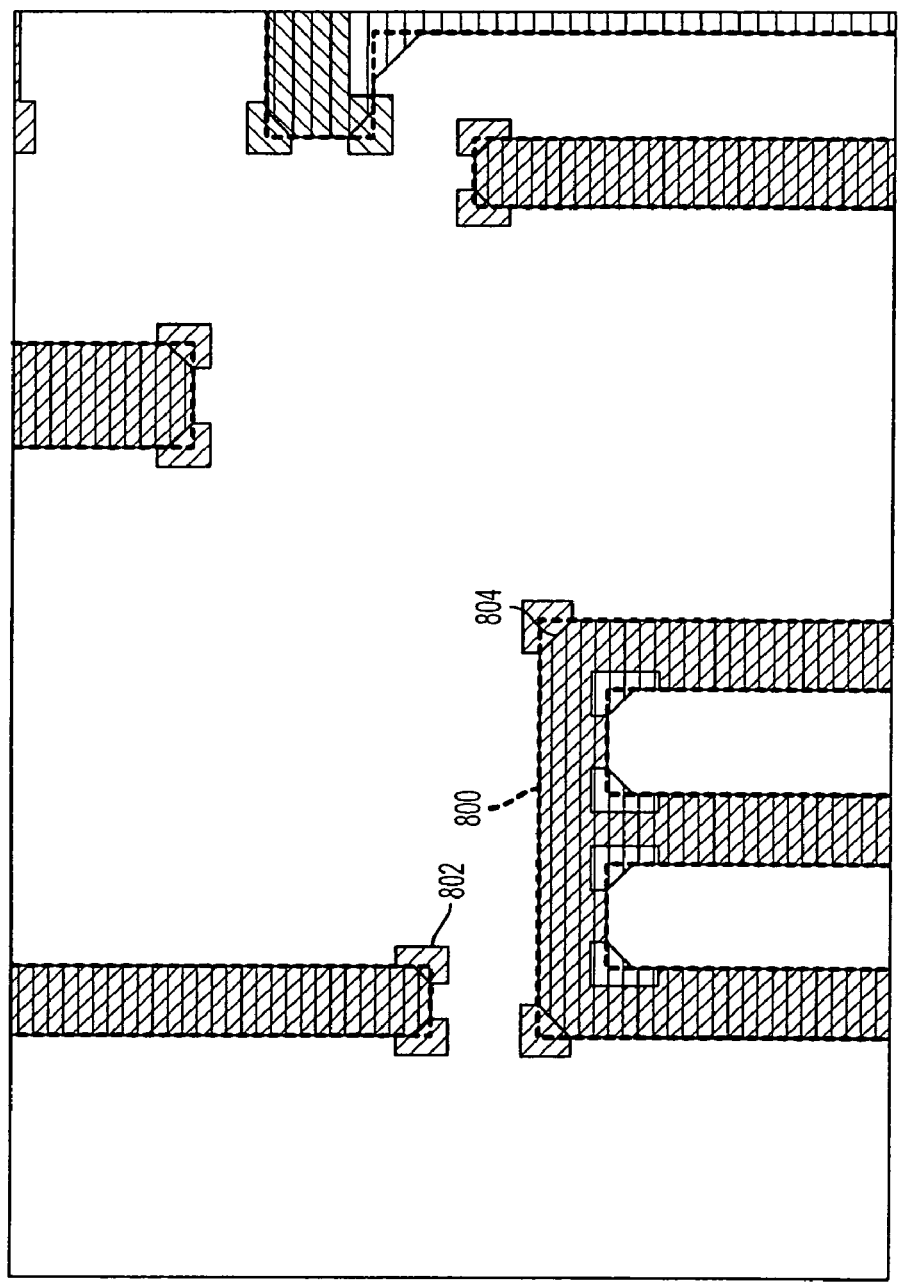
FIG. 8 illustrates a simulation of a target image, serifs applied to the target image, and chamfering of the target image.

FIG. 8 illustrates a target image 800 (dashed line), serifs 802 (diagonal hatching), and the related chamfered 804 resulting at each corner of the feature to be printed. Serif 802 and chamfer 804 dimensions have been exaggerated for illustration and explanation purposes only, and may not be best for the given pattern. In addition, serifs 802 and chamfers 804 are illustrated in the same image to simply demonstrate the concepts discussed above for determining chamfer 804 dimensions.

Figure 9:
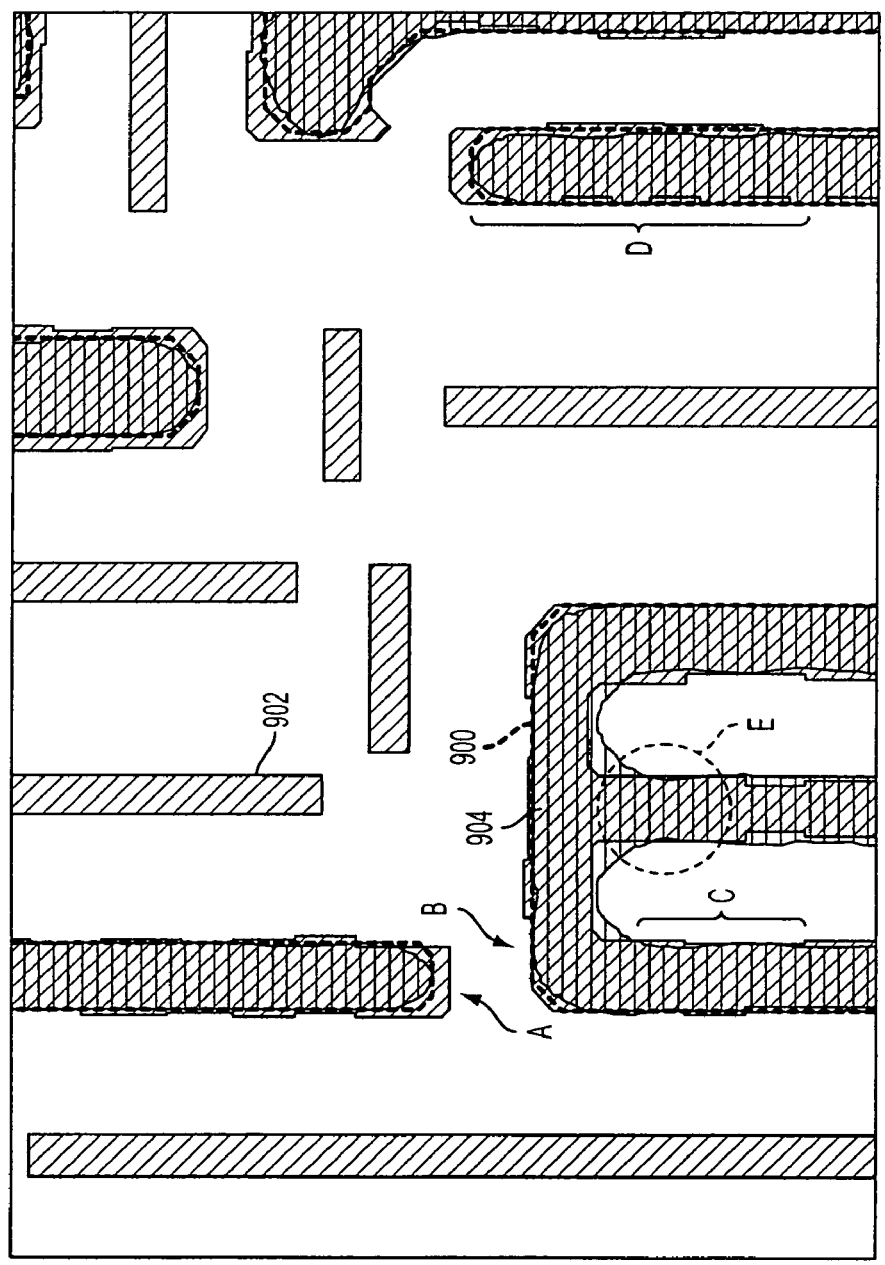
FIG. 9 illustrates simulation preformed using a median evaluation of a modified target image adjusted for chamfering at each corner.
Figure 10:
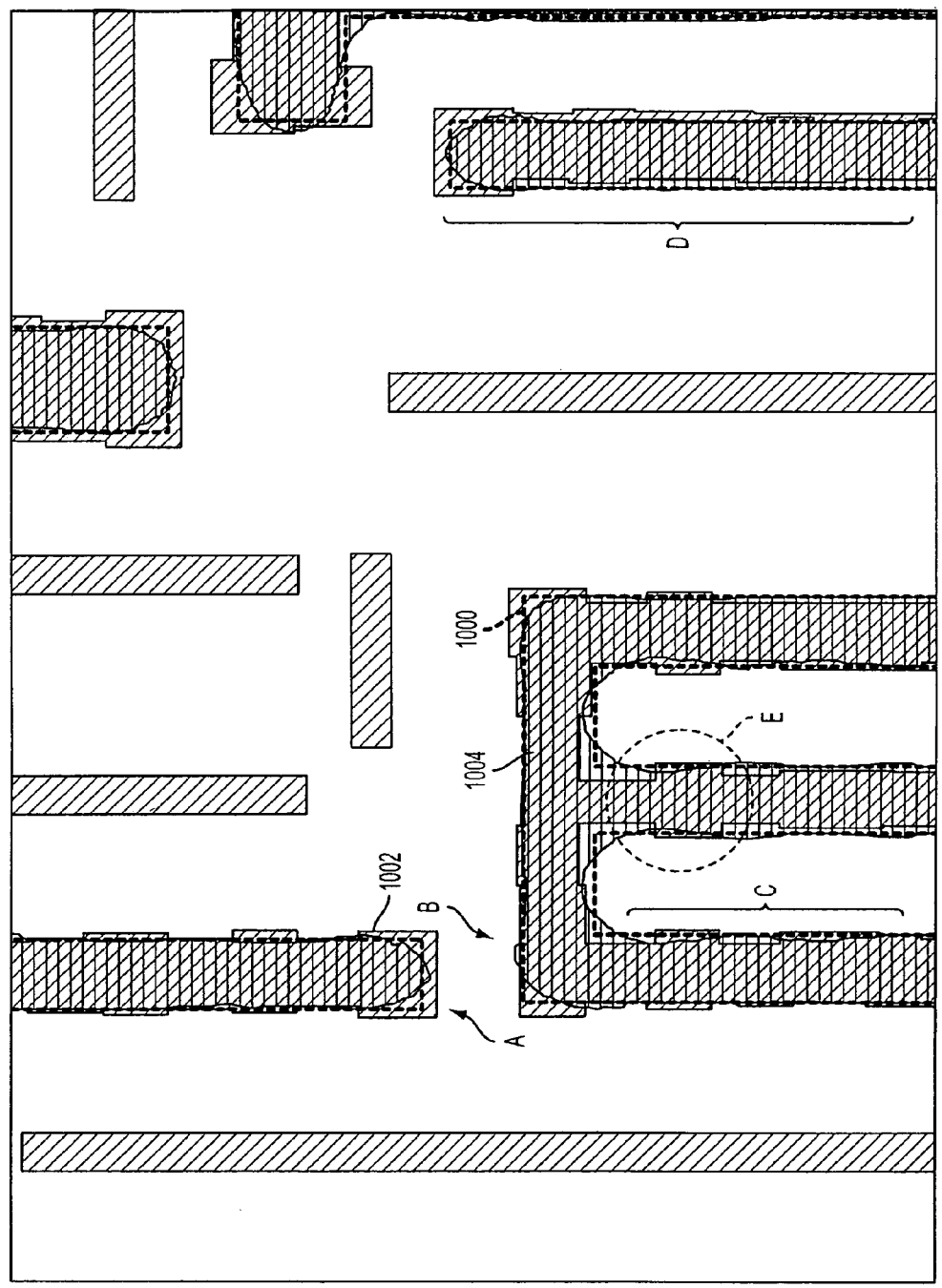
FIG. 10 illustrates the same simulation as in FIG. 9 but for an unmodified target image.

FIG. 9 illustrates simulated results from corrections performed using median evaluation, described in patent application number '833, and in accordance with the novel concepts discussed herein. FIG. 10 illustrates simulated results from corrections performed using median evaluation, described in patent application number '833 only. In FIG. 9, the target image is designated by 900 (dashed line), the corrected mask pattern by 902 (diagonal hatching), and the predicted printing results by 904 (horizontal hatching). In FIG. 10, the target image is designated by 1000 (dashed line), the corrected mask pattern by 1002 (diagonal hatching) and the predicted printing results by 1004 (horizontal hatching).

Areas A-E designated in each figure have been chosen for comparing the effects of bridging, necking (or pinching), rippling, line smoothing, and average line width. Bridging has been reduced, as best seen by referring to A and B in FIG. 9 as compared to the same in FIG. 10. Rippling has been reduced, as best seen by referring to C in FIG. 9 as compared to the same in FIG. 10. Average line width and line smoothing is better, as best seen by referring to C and D in FIG. 9 as compared to the same in FIG. 10. Necking has been reduced, as best seen by referring to E in FIG. 9 as compared to the same in FIG. 10.

Even though the aforementioned modified target image for approximating rounding is a good approximation, the target image is still nonetheless an ideal representation. Please consider the further enhancements described below.

The model OPC loop for creating the above images is as follows: (1) define mask representation corresponding to the target, (2) calculate image (aerial image or in resist), (3) determine deviation between image and target, (4) modify mask, (5) repeat until image is satisfactory. By modifying the target image for chamfered corners, this model OPC loop, as discussed above, indeed generates a superior image. However, the model OPC can be modified further to take into consideration actual corner rounding, on the target, mask or both.

Figure 11:
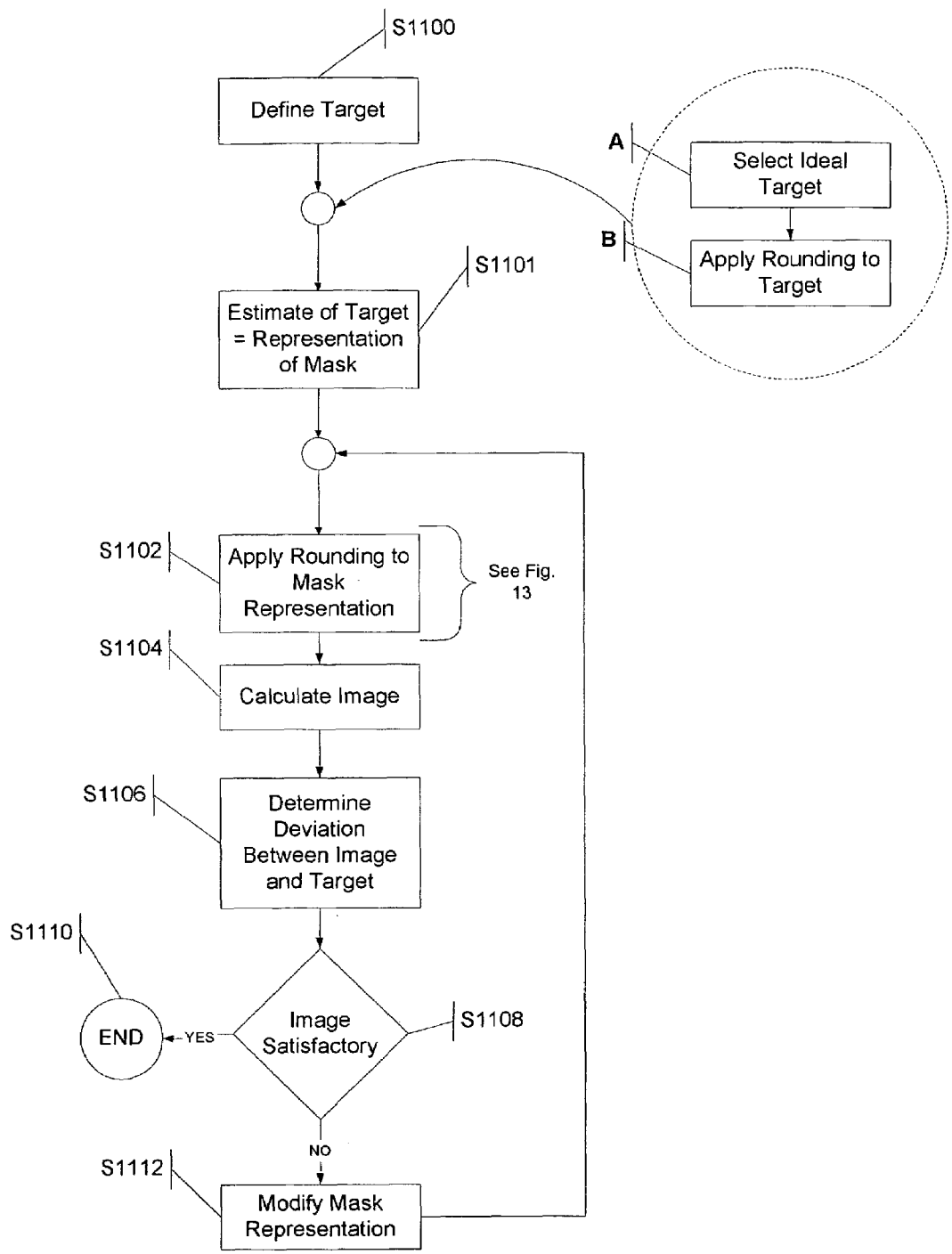
FIG. 11 illustrates a exemplary flow chart of the model OPC loop.

A mask construction function and/or target image modification function may be incorporated in the model OPC loop to factor in mask rounding that will inevitably occur with practically all lithographic printing of features having corners. FIG. 11 illustrates a exemplary flow chart of the model OPC loop incorporating both of these concepts. In Step 1100, an initial target image is defined, such as the target image 800 illustrated by FIG. 8. In Step 1101, the initial estimation of the mask is chosen to be equal to the target, defined prior to Step 1101. Steps A and B may be incorporated following Step 1100, in which an ideal target is chosen, i.e., a target having sharp corners, and approximate rounding or chamfers is applied to respective corners of the target image, respectively. This way a more realistically achievable target is generated. This step of approximating rounding of the target accounts for the a prior knowledge that the projection system acts as a low pass filter, and hence will never be able to image sharp corners.

In Step 1102, rounding may be applied to the initial estimation of the mask to factor in the actual rounding of corners of features on an actual mask (Step 1102). The rounding is typically due to mask manufacturing constraints. Such manufacturing constraints are well known to those of ordinary skill in the art. In Step 1104, an image is generated based on the mask representation generated in Step 1102, and in Step 1106, deviation between the image generated and the representation is determined. Based on predefined constraints, it is determined whether the image is satisfactory (Step 1108). The manner of setting predefined constraints and judging whether an image is satisfactory is well known within the lithography art. If the image is acceptable, the process is ended (Step 1110) and a mask may be generated based on the representation of the mask used to generate the image of Step 1104. Alternatively, if the image is unsatisfactory, the representation of the mask may be modified in accordance with well-known OPC techniques (Step 1112). Steps 1102-1108 are repeated until the image is satisfactory.

Figure 12:
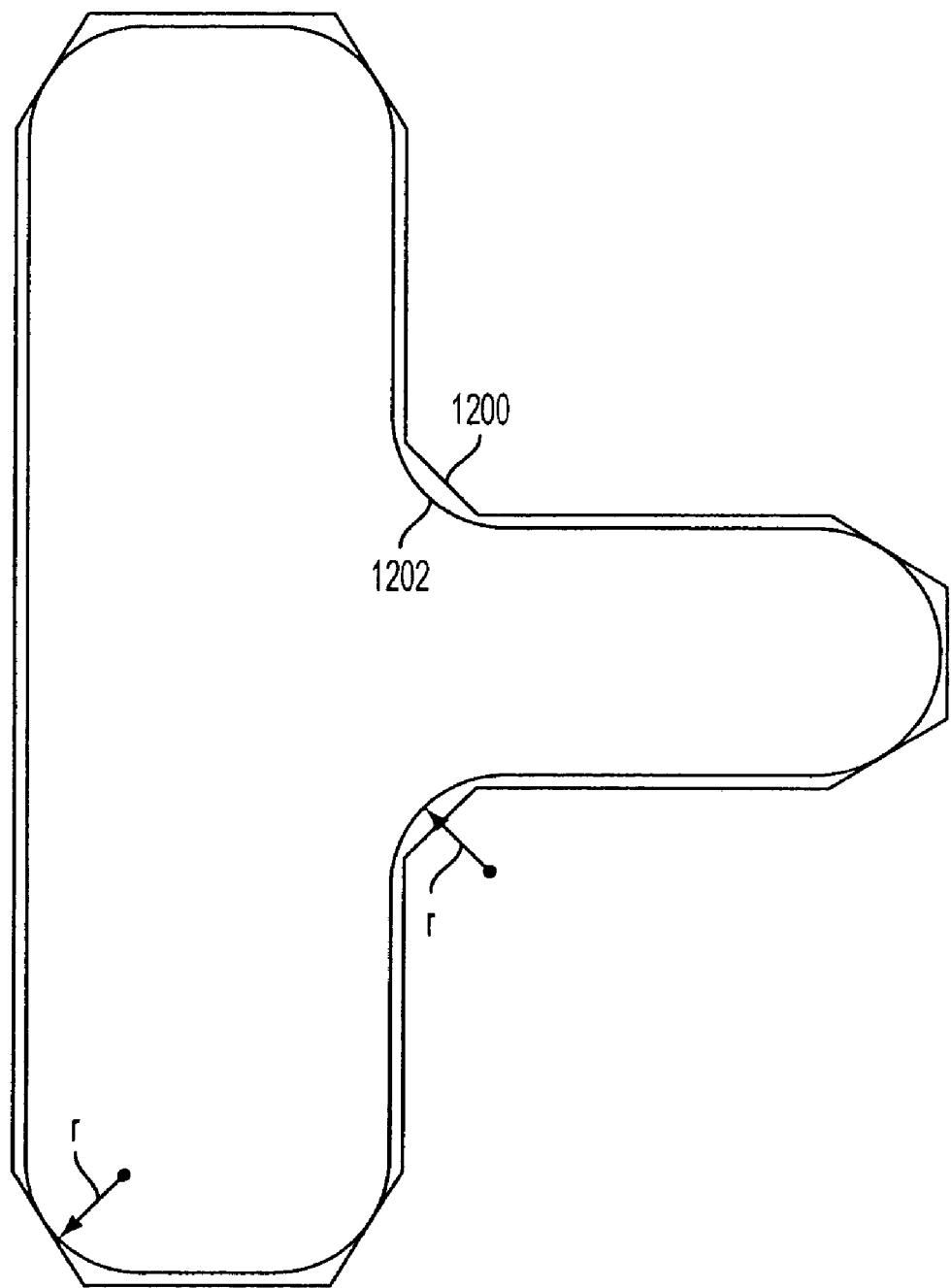
FIG. 12 illustrates a target image, modified by chamfering to simulate rounding, and a target image modified in step to apply rounding.

FIG. 12 demonstrates the similarity between the target modification of Step B (FIG. 11) and modification of the mask representation (Step 1102). More particularly, FIG. 12 illustrates a target image 1200, modified by chamfering to simulate rounding, and a mask representation 1202 modified in step 1104 to apply rounding. Target 1200 has been enlarged slightly relative to target image 1202 for illustration and explanation purposes. By applying rounding to the mask representation, a better representation of imperfections of corners, can be approximated. Furthermore, the actual rounding of the mask representation complements the target image to which approximate rounding has been applied. In other words, the actual rounding of the mask representation can be said to round the chamfered corners of the target image.

FIG. 12 also illustrates yet another concept in which each corner is rounded at the predetermined radius, r. As discussed herein, effects of rounding is known, and can be approximated generally for most types of printing. For instance, the inventors have found that for a typical mask making process radii in the range of 40-80 nm, measured at the reticule, can be expected. Of course, radii of different magnitudes can be chosen depending on complexity of the mask feature and mask making process or mask-writer system parameters.

Figure 13:
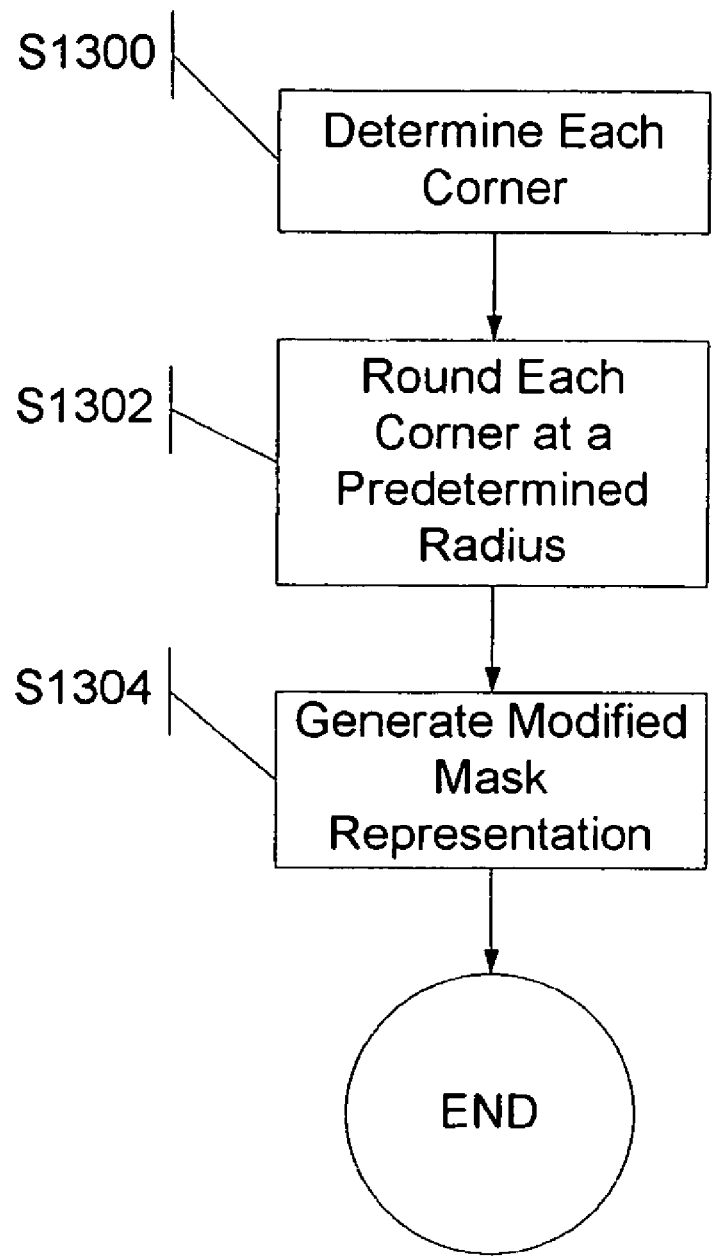
FIG. 13 illustrates a flowchart generally applying rounding during the corresponding step of FIG. 11.
Figure 14:
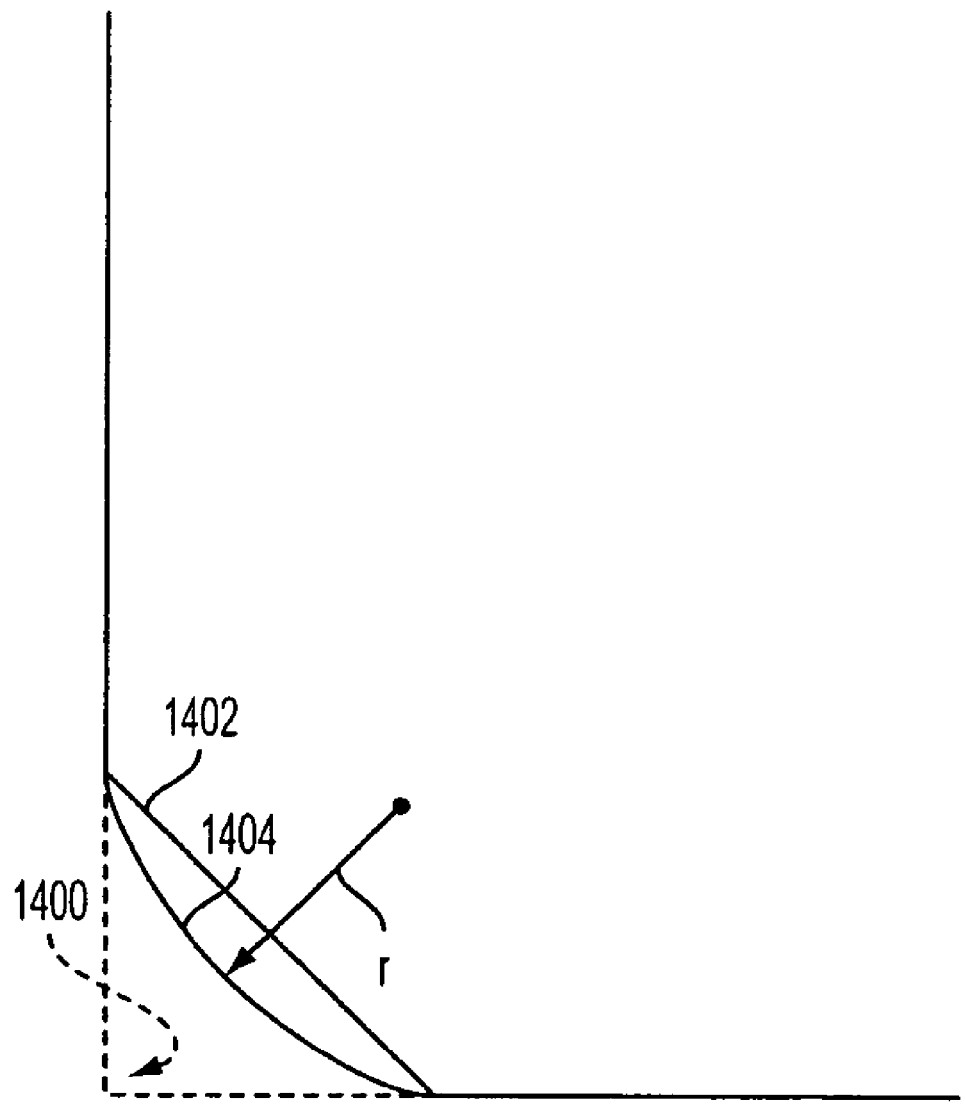
FIG. 14 illustrates a corner, which has been rounded, at the wafer level.

FIG. 13 illustrates a flowchart generally applying rounding during Step 1102 of FIG. 11. Generally, each corner is examined, as in Step 1300, and rounding of a predetermined radius is applied, in step 1302. In step 1304, a modified mask representation (See 1202, FIG. 12) is generated, and OPC is conducted based on this image. FIG. 14 further illustrates this concept. A corner 1400, which has been rounded 1404, at the wafer level basically corresponds to the size of the chamfer 1402 of the target image.

Accordingly, either or both the modification of the target image to approximate rounding or modification of the representation of the mask to simulate rounding due to mask manufacturing constraints may be used to optimize the final mask.

Figure 15:
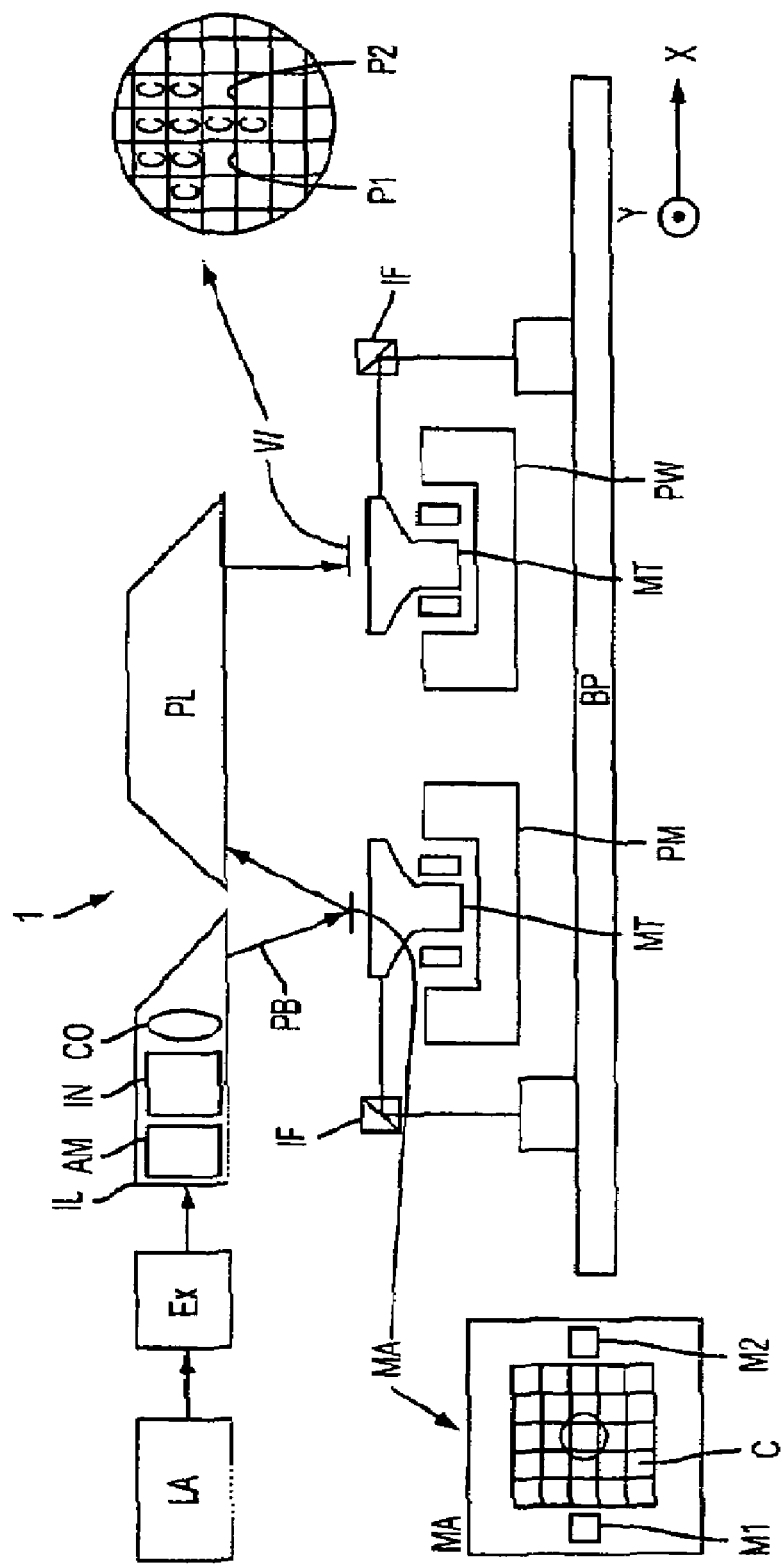
FIG. 15 schematically depicts a lithographic projection apparatus suitable for use with a mask designed with the aid of the current invention.

FIG. 15 schematically depicts a lithographic projection apparatus suitable for use with a mask designed with the aid of the current invention. The apparatus comprises:
- a radiation system Ex, IL, for supplying a projection beam PB of radiation. In this particular case, the radiation system also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e., has a transmissive mask). However, in general, it may also be of a reflective type, for example with a reflective mask. Alternatively, the apparatus may employ another kind of patterning means as an alternative to the use of a mask; examples include a programmable mirror array or LCD matrix.

The source LA (e.g. a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 15 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 15. However, in the case of a wafer stepper (as opposed to a step-and-scan tool) the mask table MT may just be connected to a short-stroke actuator, or may be fixed.

The depicted tool can be used in two different modes:
- In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash." Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultraviolet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high-energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The concepts disclosed herein may be used as a simulator, i.e., as a computer program product capable of being implemented on a computer system. Software functionalities of the computer system involve programming, including executable code, which may be used to implement the above-described imaging model. The software code is executable by the general-purpose computer. In operation, the code and possibly the associated data records are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions, in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platform, discussed above. Volatile media include dynamic memory, such as main memory of such a computer platform. Physical transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly-used media such as punch cards, paper tape, any other physical medium with patterns of holes, a RAM, a PROM and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A method of optimizing a design to be formed on a substrate, comprising the steps of:
    (a) determining approximate rounding of at least one corner of an image of the design based on a derivation of a predefined rule concerning a sub-lithographic assist feature for sharpening the corner of the design to be formed on the substrate when positioned on a mask at a position corresponding to the at least one corner;
    (b) generating a representation of the design further to the approximate rounding of the at least one corner;
    (c) generating an initial representation of a mask utilized to image the design based on the representation; and
    (d) performing Optical Proximity Correction (OPC) further to the initial representation of the mask.

2. The method of optimizing the design, according to claim 1, wherein step (d) further comprises the steps of:
    (e) generating an image of the design further to the initial representation of the mask;
    (f) evaluating deviation between the representation generated in Step (b) and the image generated in Step (e);
    (g) determining whether a result of the evaluation of Step (f) satisfies predefined constraints;
    (h) in the event the result does not satisfy predefined constraints, generating a next representation of the mask in accordance with the results; and
    (i) repeating Steps (f)-(h) until the deviation meets predefined constraints.

3. The method, according to claim 1, further comprising the steps of:
    (i) determining the approximate rounding based on a derivation of predefined rules;
    (ii) selecting a size of a cutout from a chamfer based on the approximate rounding; and
    (iii) chamfering the at least one corner to approximate rounding in accordance with the size of the cutout.

4. The method, according to claim 3, wherein the predefined rules define dimensions of a serif.

5. The method, according to claim 3, further comprising the step of selecting a shape of the cutout from the chamfer.

6. The method, according to claim 5, wherein at least two angles of the shape of the cutout are equal.

7. The method, according to claim 3, wherein the size of the cutout from the chamfer is based on the chamfer forming angles in increments of a predetermined size.

8. The method, according to claim 7, wherein the predetermined size is 45 degrees.

9. The method, according to claim 1, further comprising the step of chamfering the at least one corner of the design to approximate the rounding.

10. The method, according to claim 1, wherein the approximate of the rounding corresponds to minimal rounding based on a set of predetermined processing factors.

11. The method, according to claim 9, wherein the chamfer corresponds to a first chamfer corresponding to a first corner of the design, further comprising the steps of:
    (i) determining a size of a second cutout from a second chamfer for a second corner adjacent to the first corner; and
    (ii) reducing the size of at least one of the first chamfer and the second chamfer so that the first chamfer and the second chamfer do not intersect.

12. The method, according to claim 9, wherein the chamfer corresponds to a first chamfer corresponding to a first corner of the design, further comprising the steps of:

(i) determining a size of a second cutout from a second chamfer for a second corner adjacent to the first corner; and (ii) reducing the size of the first chamfer and the second chamfer proportionally so that the first chamfer and the second chamfer do not intersect.

13. The method, according to claim of claim 3, wherein the predefined rules concern serif selection, further comprising the step of:

selecting the size of the chamfer based on the overlap values of a serif selected using the predefined rules.

14. The method of optimizing the design, according to claim 2, further comprises the steps of:

(i) determining rounding of corners of the initial representation of the mask based on mask manufacturing constraints; and (ii) generating a modified mask representation based on the initial representation in which corner rounding is applied.

15. The method of optimizing the design, according to claim 14, wherein rounding at each corner has a predetermined radius.

16. A computer readable medium having executable code thereon, wherein execution of the code by at least one programmable computer causes the at least one programmable computer to perform a sequence of steps as in any one of claims 1-15 for optimizing the design to be formed on the substrate.

* * * * *